(12) United States Patent
Glebov

(10) Patent No.: US 6,828,606 B2
(45) Date of Patent: Dec. 7, 2004

(54) SUBSTRATE WITH EMBEDDED FREE SPACE OPTICAL INTERCONNECTS

(75) Inventor: Alexei Glebov, San Mateo, CA (US)

(73) Assignee: Fujitsu Limited, Kawasaki (JP)

(*) Notice: Subject to any disclaimer, the term of this patent is extended or adjusted under 35 U.S.C. 154(b) by 0 days.

(21) Appl. No.: 10/414,932

(22) Filed: Apr. 15, 2003

(65) Prior Publication Data

US 2004/0206988 A1 Oct. 21, 2004

(51) Int. Cl.[7] .............................................. H01L 29/74
(52) U.S. Cl. .................. 257/244; 257/513; 257/117; 257/118; 257/534
(58) Field of Search ............................... 257/117, 118, 257/513, 534, 244

(56) References Cited

U.S. PATENT DOCUMENTS

| | | | | |
|---|---|---|---|---|
| 3,974,514 A | * | 8/1976 | Kressel et al. | ............ 257/98 |
| 4,931,336 A | * | 6/1990 | Haneda | ............ 428/64.4 |
| 4,940,302 A | * | 7/1990 | Houk et al. | ............ 385/15 |
| 5,424,573 A | * | 6/1995 | Kato et al. | ............ 257/431 |
| 6,321,011 B2 | * | 11/2001 | Deacon | ............ 385/50 |

FOREIGN PATENT DOCUMENTS

JP 5-275667 * 10/1993 ............ 257/436

* cited by examiner

Primary Examiner—Jasmine Clark
(74) Attorney, Agent, or Firm—Sheppard Mullin Richter & Hampton LLP

(57) ABSTRACT

Substrates with embedded free space light guiding channels for optical interconnects, and methods for making such substrates are shown. The method comprising steps of a groove in a first generally planar body, and combining the first body with a second generally planar body to form the substrate, and providing input and output ports to enable light to travel into and out of the groove. The first and second bodies may be made of silicon, polymers or combinations of the two. Additional generally planar bodies may be incorporated to provide for complex, 3D optical signal routing within the substrate.

16 Claims, 7 Drawing Sheets

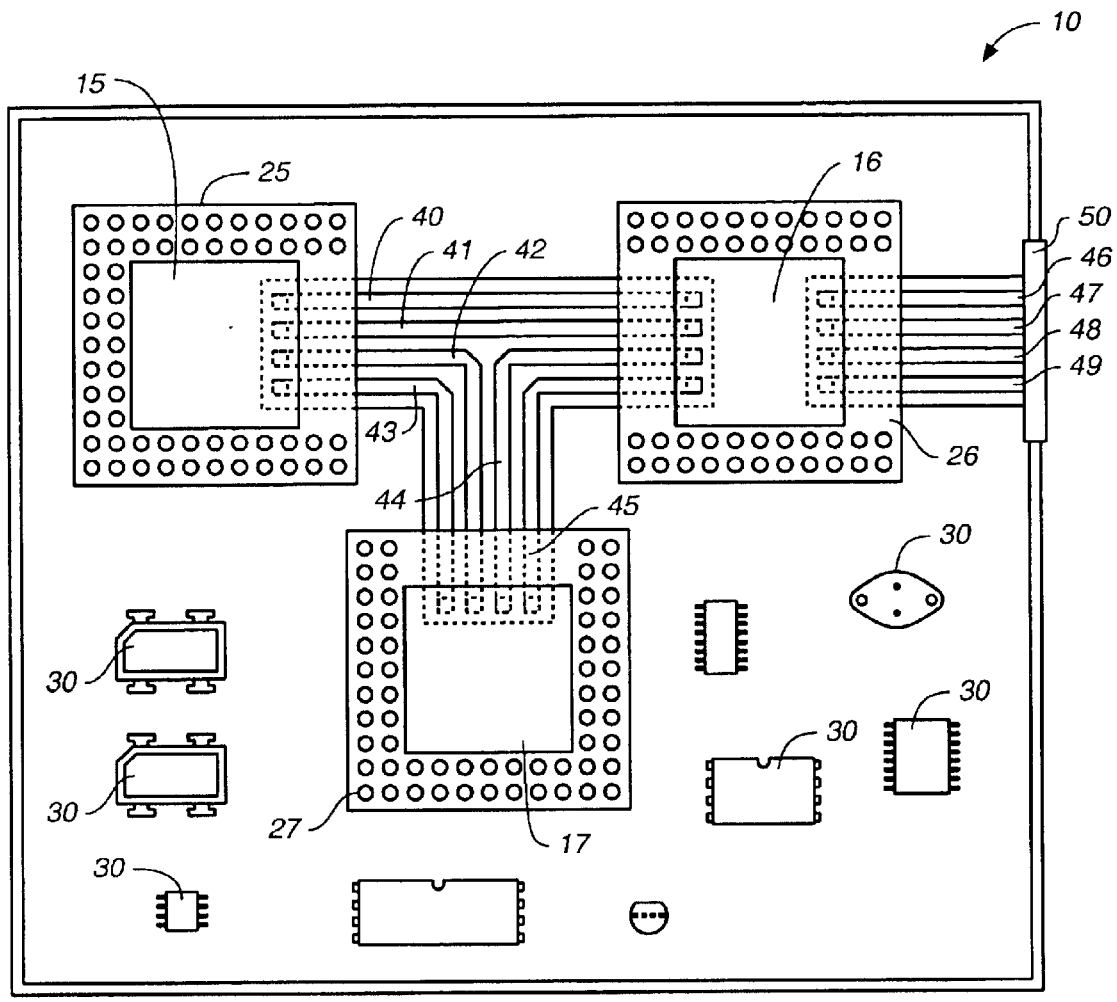
FIG._1A
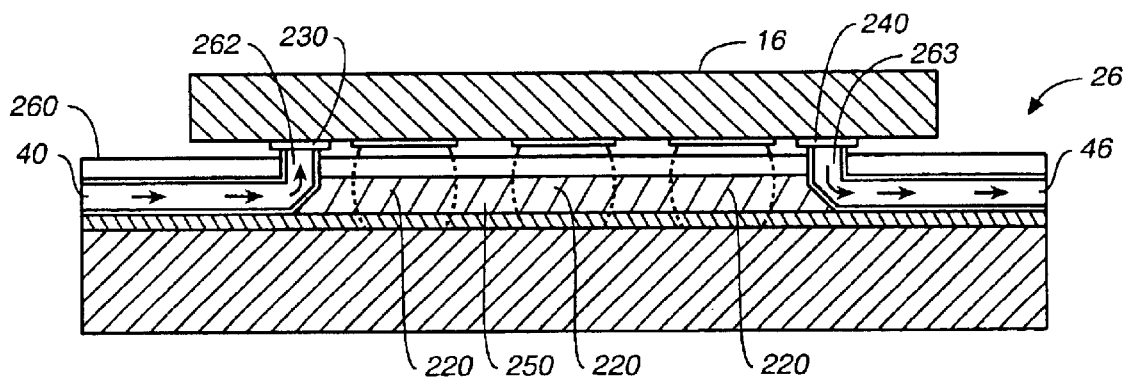
FIG._2A

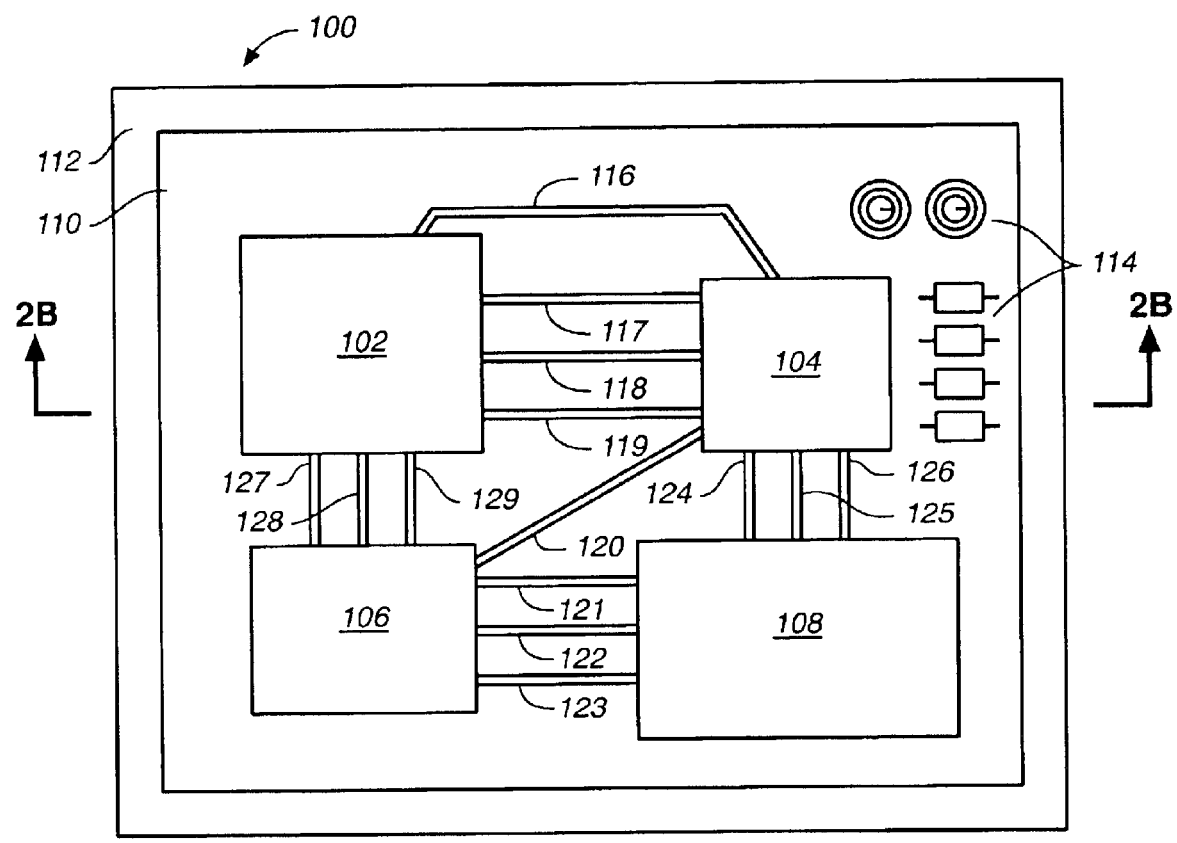
FIG._1B
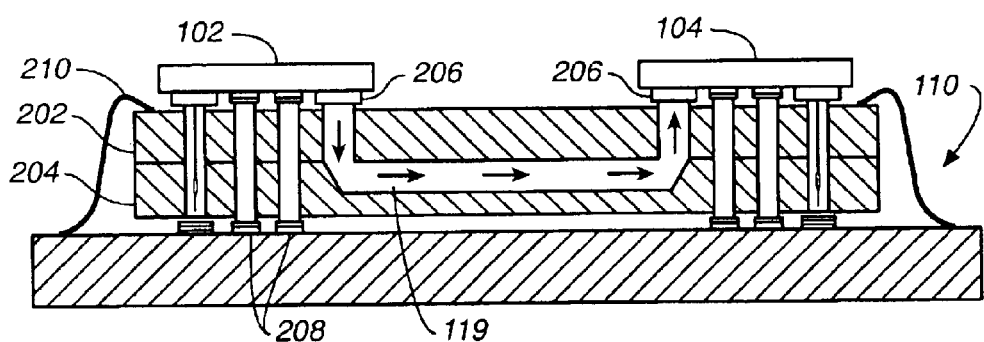
FIG._2B

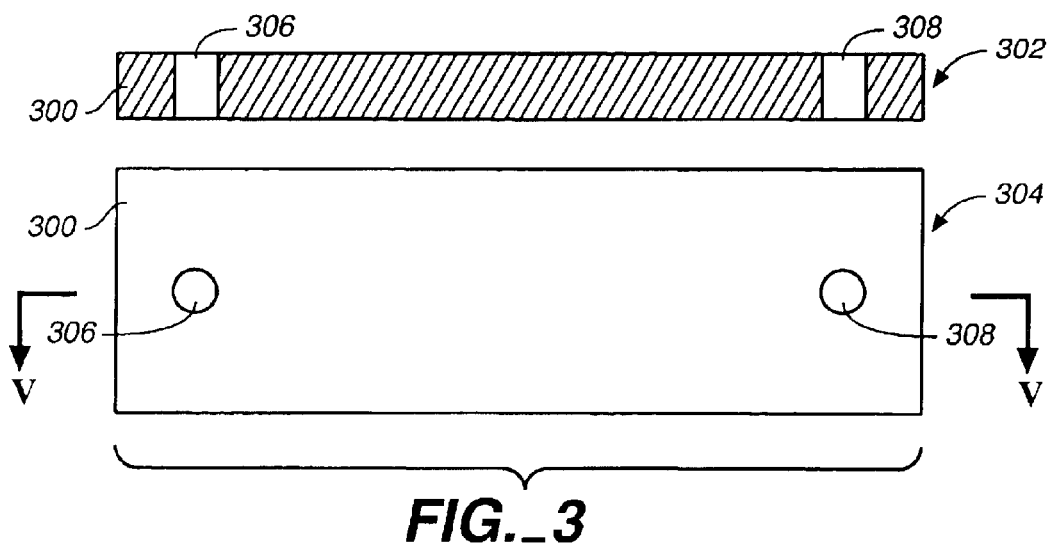
FIG._3
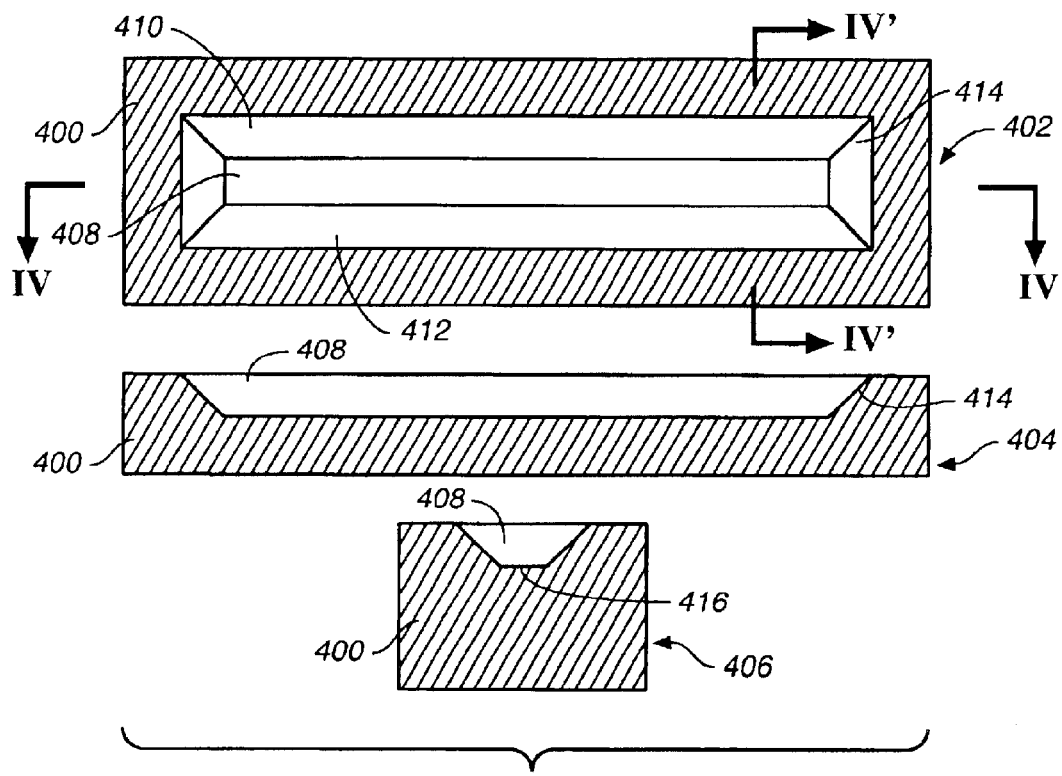
FIG._4
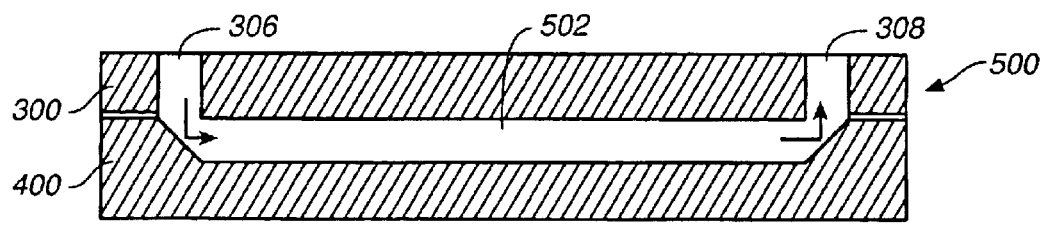
FIG._5

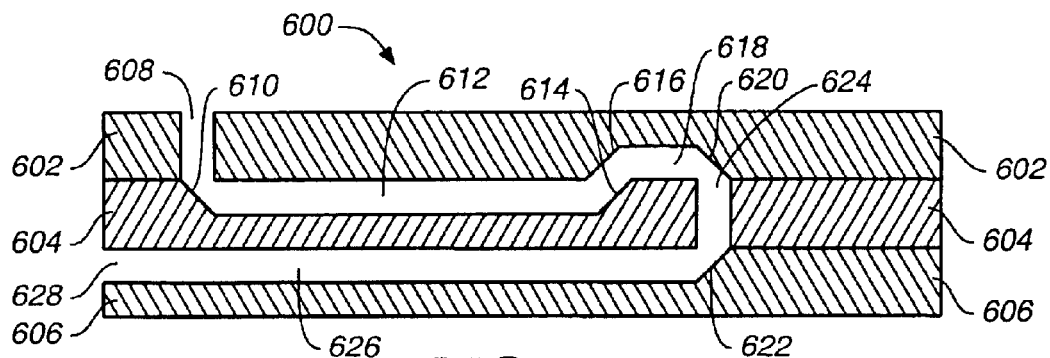
FIG._6
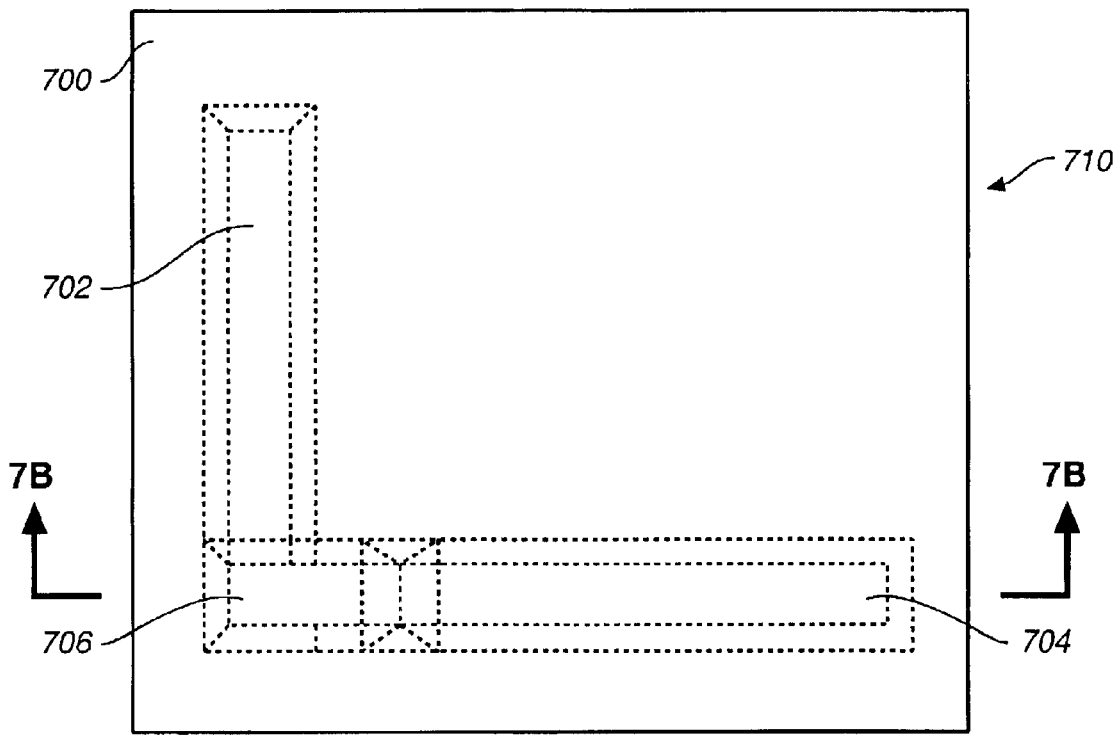
FIG._7A
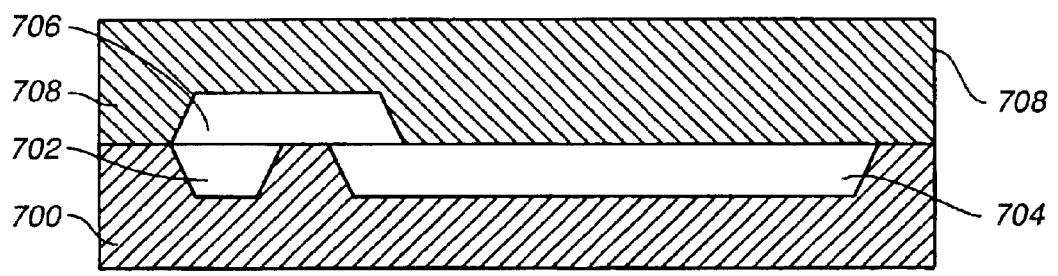
FIG._7B

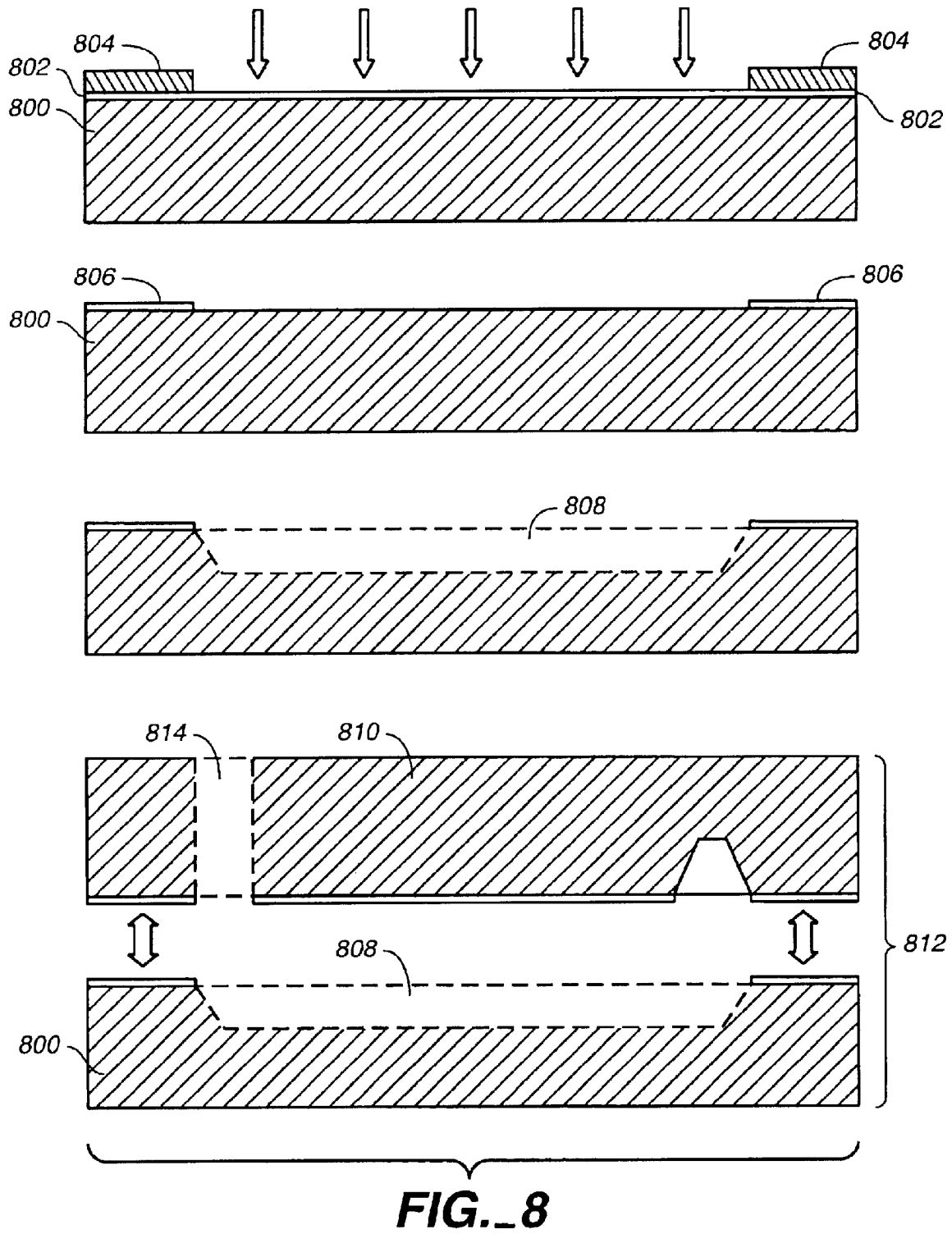
FIG._8

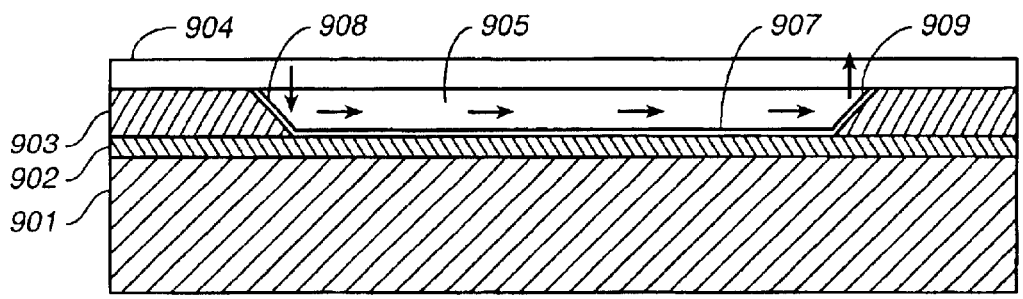
FIG._9A
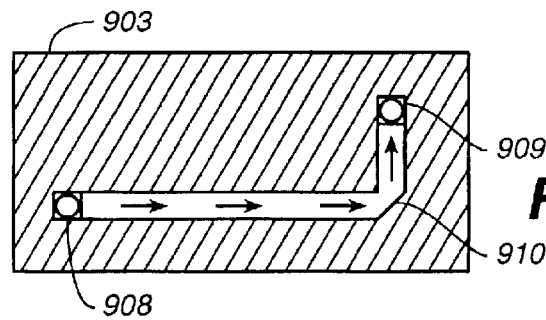
FIG._9B
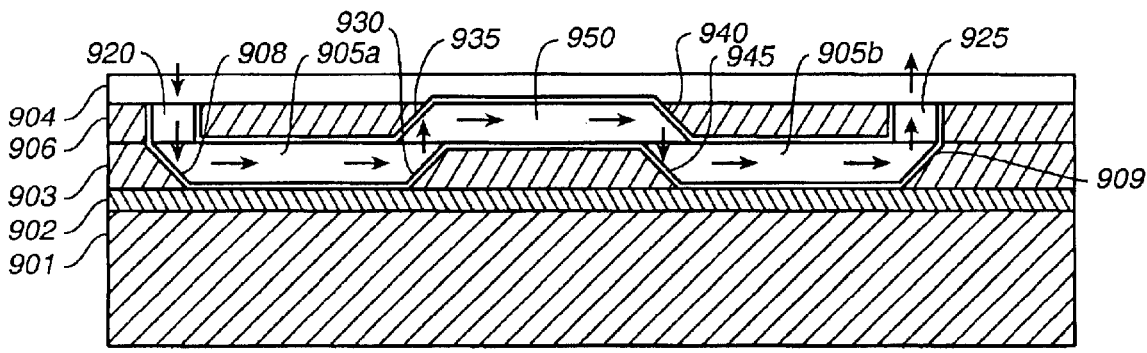
FIG._9C
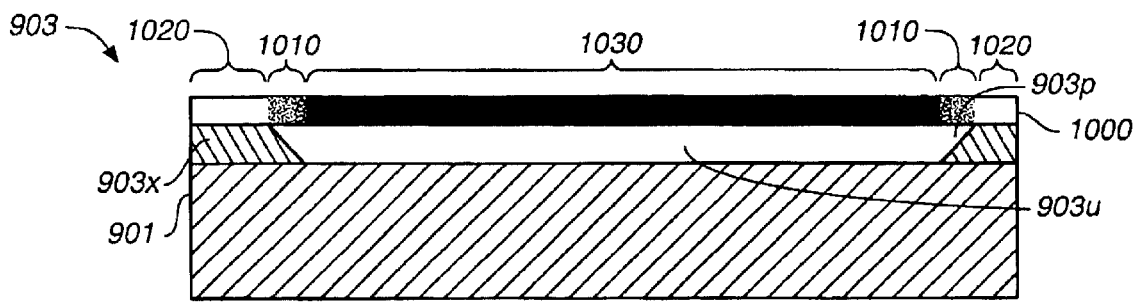
FIG._10

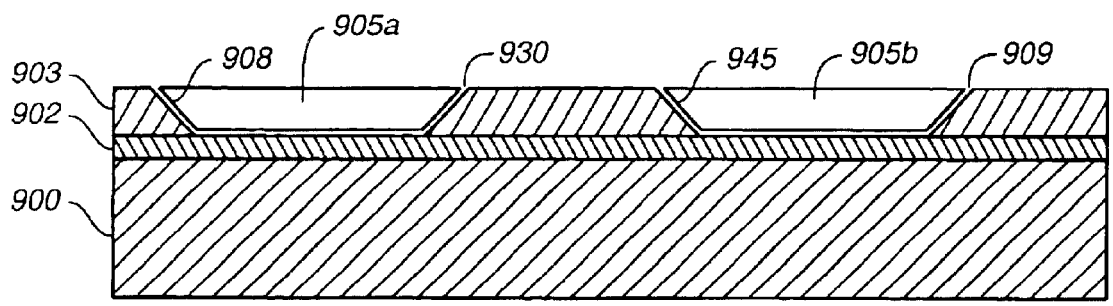
FIG._11A
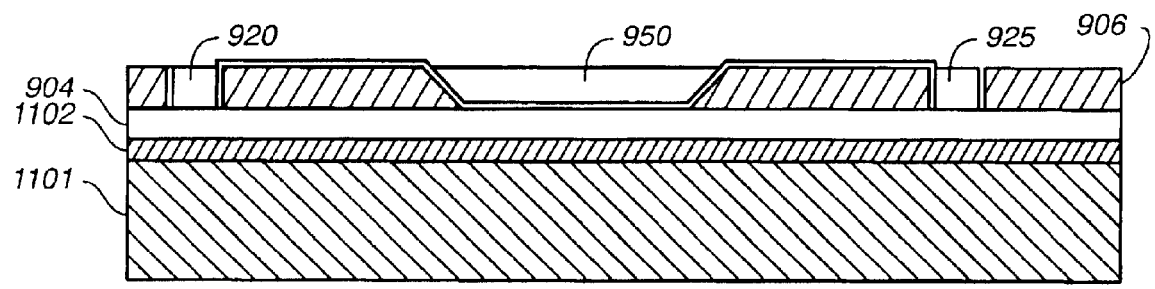
FIG._11B
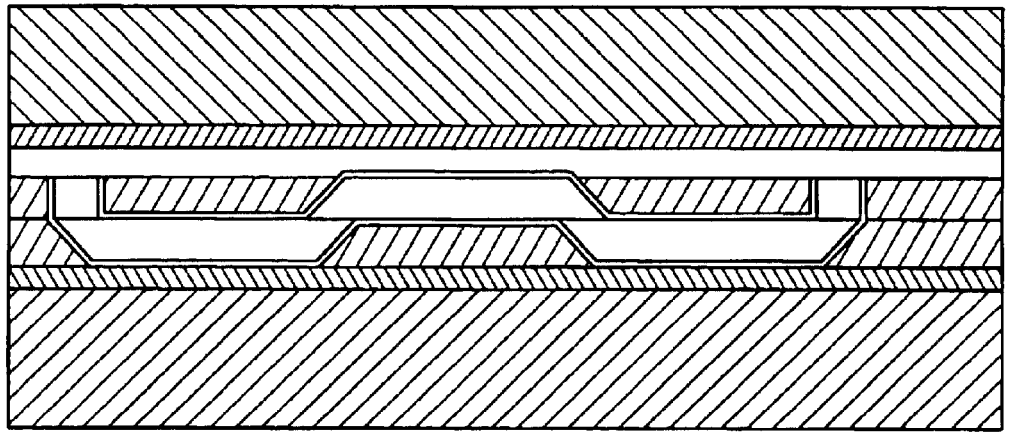
FIG._11C

SUBSTRATE WITH EMBEDDED FREE SPACE OPTICAL INTERCONNECTS

FIELD OF THE INVENTION

The present invention relates generally to electronic device interconnection technology, and more particularly, to substrates with channels that allow optical interconnections between electronic components.

BACKGROUND OF THE INVENTION

As integrated circuits (ICs) and other active electronic devices become smaller and more complex, and as the operational frequencies of such devices increase, interconnection technology has become more important. For example, multi-chip modules (MCMs), which integrate several devices into a single package, require sophisticated interconnections between the devices. These interconnections must be reliable, efficient and cost effective to produce. Unfortunately, conventional interconnection technologies provide electrical transmission of signals and have several disadvantages, which are an impediment to the development of higher speed, higher density modules requiring complex interconnects.

In use, ICs are typically mounted on printed circuit boards (PCBs—sometimes referred to as "printed wired boards" or PWBs) either directly or using interposer substrates, which provide connections to other active and passive devices mounted either on the interposer substrate, on the PCB or which are external to the substrate. Interposers are sometimes used in IC packages to provide high density and increased functionality of the packaged devices. Particularly useful are silicon interposers, fabricated from silicon wafers, which may contain high density interconnects and passive devices. One or more IC "chips" can be mounted on an interposer, which may then, in turn, be mounted on a PCB or other substrate, so that the interposer forms an intermediate packaging level between the ICs and the PCB. A silicon interposer may also contain imbedded passive components, and thereby bring the passive components closer to the IC chips resulting in reduced parasitic interconnect inductances. Furthermore, a silicon interposer allows coefficient of thermal expansion (CTE) matching between the IC and the printed circuit board, and therefore improves the mechanical robustness of the package.

Whether an IC is mounted directly on a PCB, or indirectly using an interposer, it is necessary to provide input and output signal paths to and from the IC. As the density and speed of ICs have increased, the use of electrical signal paths has become a limiting factor. The major causes for delays in conventional inter-chip transmission lines are the capacitive loading of the lines and the line resistivity, which both limit the phase velocity of a propagating electrical signal. In addition, the ability to decrease the spacing between electrical paths is limited by the need to avoid "cross talk" between the paths.

Therefore, it would be desirable to have a system that provides complex, high density interconnects that avoids the problems associated with conventional technology, and thereby enables the use of devices having high component densities and high operational frequencies.

SUMMARY OF THE INVENTION

In one embodiment of the present invention, a method is provided for transmitting light of at least one wavelength of interest in an substrate having active devices mounted thereon, comprising steps of forming a groove having reflective walls in a generally planar body, mounting at least one additional layer on the body to substantially cover the groove to form an optical transmission channel in the substrate, and providing an optical ports on said substrate for communicating light into and out of the optical transmission channel. One or both of the body and the additional layer may be formed from silicon or a polymer. In one embodiment, the groove is formed by wet etching (001) crystalline silicon such that angled walls are formed as a result of the etching process. In another embodiment the groove is formed in a polymer layer formed on a base layer. In this embodiment it is preferable that the polymer is photo-definable. The walls of the groove may be coated with a material which is reflective to said light, preferably a metal such as aluminum or gold. According to an aspect of the present invention, complex or "3D" light paths may be formed, i.e., light paths within the substrate wherein the light is redirected multiple times. Embodiments used for complex light paths may include multiple layers.

In another aspect the present invention is directed to a substrate for mounting one or more active devices, comprising a body having a groove with reflective walls formed therein, and an additional layer mounted on said body, said additional layer having a surface portion which covers and encloses a major portion of said groove, said surface portion being reflective to said light wavelength, said second body having optical input and output ports formed therein and communicating with said groove, thereby forming an optical path within said substrate.

In another aspect the present inventions comprises a substrate for mounting one or more active devices, having a generally planar rigid base layer, a first polymer layer formed above said rigid base layer, said polymer layer having at least one groove formed therein, said groove having walls that are reflective to a desired wavelength of light, and having at least one angled surface for redirecting light propagating within said groove, a cover layer formed above said first polymer layer, said cover layer having upper and lower surfaces and being substantially transparent to light traveling generally normal to said upper and lower surfaces, and, a light input and a light output for communicating light into and out of said substrate.

In a further aspect, the present invention comprises a method for making a optical transmission path within a substrate, comprising the steps of providing a rigid base layer, forming a first polymer layer over said rigid base layer, said polymer layer having an upper surface, forming at least one groove having at least one angled surface for reflecting light in said polymer layer, coating said groove and said angled surface with a thin film of reflective material, providing a temporary substrate having an upper surface, forming a sacrificial layer on said upper surface of said temporary substrate, forming a second polymer layer on said sacrificial layer, said polymer layer having an upper surface, attaching the upper surface of said first polymer layer to the upper surface of said second polymer layer, and thereafter, removing said sacrificial layer and said temporary substrate.

BRIEF DESCRIPTION OF THE DRAWINGS

The foregoing aspects and the attendant advantages of this invention will become more readily apparent by reference to the following detailed description when taken in conjunction with the accompanying drawings wherein:

FIG. 1A shows a plan view of a PCB with multiple integrated circuits connected with optical interconnects in accordance with the present invention;

FIG. 1B shows a plan view of an interposer that has integrated circuits connected with optical interconnects in accordance with the present invention;

FIG. 2A shows a cross-section view of a IC chip mounted on a PCB, showing an optical path leading to an input detector on the IC and an optical path connected to an output laser on the IC;

FIG. 2B shows a cross-section view of the interposer of FIG. 1B illustrating an optical interconnect between two ICs mounted on the interposer;

FIG. 3 shows side and top views of a top silicon plate used for forming a light channel in accordance with the present invention;

FIG. 4 shows top, cross-sectional side, and cross-sectional edge views of a bottom silicon plate used for forming a light channel in accordance with the present invention;

FIG. 5 shows a structure that forms an optical guiding channel when the top and bottom plates of FIGS. 3 and 4 are combined;

FIG. 6 shows a cross-sectional view of a silicon interposer that includes two light guiding levels, thereby providing complex signal routing in accordance with the present invention;

FIGS. 7A and 7B show plan and cross-sectional views, respectively, of a silicon interposer structure that illustrates how horizontal bending with an angle of 90 degrees can be realized using silicon light guiding channels;

FIG. 8 illustrates a process for fabrication of tapered grooves in a silicon interposer; and FIGS. 9A–C show silicon interposer structures with light guiding channels formed in a polymer layer.

FIG. 10 shows a cross section of a substrate with an exposed photoimageable polymer and a gray scale mask.

FIGS. 11A–11C show cross sections of intermediate structures used for forming the complex light guide of FIG. 9C.

DETAILED DESCRIPTION OF THE INVENTION

The present invention is directed to device substrates, such as a PCBs or interposers, which have optical transmission paths or channels formed therein. The optical transmission channels provide optical interconnects between devices mounted on the substrate and/or between devices mounted on the substrate and devices external to the substrate. The optical transmission paths of the present invention may be used to overcome the problems associated with conventional interconnects. For example, optical interconnects, provided in accordance with the present invention, are free of capacitive loading which causes signal delays. Therefore, transmission over optical lines is faster compared to electrical transmission. Also, there is no cross-coupling between optical signals propagating in adjacent optical paths, even at very close spacing, thereby allowing very high density. Moreover, light can be transmitted in multiple directions in an optical path without interference. In addition, optical paths may be used to carry light signals of different wavelengths such as in coarse wavelength division multiplexing (CWDM) can be used. In CWDM the signals at different wavelengths can be transmitted through the same optical channel without intermixing and thus the interconnect density can be significantly increased.

FIG. 1A shows a first exemplary embodiment of the present invention, comprising three ICs, 15, 16 and 17, and their packages, 25, 26 and 27 mounted on a PCB substrate 10. Except for the free space optical interconnects described below, PCB 10 is otherwise conventional. Packages 25, 26 and 27 may comprise interposers, and are attached to PCB 10 using pins, solder balls or any other method used in the industry. Additional active and passive components, generally depicted with the reference number 30, may also be mounted on PCB 10.

In addition to regular electrical connections, PCB 10 comprises a plurality of free space optical interconnects 40–49. In this example, optical interconnects 40 and 41 provide signal paths between ICs 15 and 16, optical interconnects 42 and 43 provide signal paths between ICs 15 and 17, optical interconnects 44 and 45 provide signal paths between ICs 16 and 17, and optical interconnects 46–49 provide signal paths between IC 16 and devices (not shown) external to PCB 10, via a fiber connector 50 at the edge of the PCB 10. As shown, the free space optical interconnects of the present invention may be used to provide straight line signal routing, e.g., interconnects 41, 42 and 46–49, or complex signal routing involving, for example, a 90° turn, e.g., interconnects 42–45.

FIG. 1B shows another embodiment of the present invention. Shown is a plan view of a silicon interposer that has a plurality of ICs mounted thereon to form a multichip module. The ICs are connected with free space optical interconnects in accordance with the present invention. The multichip module comprises ICs 102, 104, 106 and 108. The ICs are mounted on a silicon interposer 10 that is further mounted on a circuit substrate 112, such as a PCB, only a portion of which is shown. The multichip module may also include passive components, shown generally at 114.

In accordance with the embodiment of FIG. 1B, interposer 110 comprises a plurality of free space optical channels 116–129, that provide optical interconnection between the integrated circuits. For example, channel 119 provides a path that allows transmission of optical signals between ICs 102 and 104.

FIG. 2A is a cross sectional view of an IC chip 16 mounted directly on a PCB 10 using conventional solder balls or "bumps" 220. While solder ball mounting is shown, any suitable method of attachment may be used. IC 16 has an optical input device 230, such as a photodetector, formed therein for receiving light signals traveling in free space optical path 40, and a optical output device 240, such as a semiconductor laser or photodiode, formed therein, for outputting light signals via free space optical path 46. Optical paths 40 and 46 provide interconnection with other devices (not shown) which may either be mounted on PCB 10, or which may be located elsewhere. Channels from optical interconnects 40 and 46 are formed in layer 250 on the PCB substrate. Layer 250 may comprise a polymeric material such as polyimide or epoxy in which grooves are formed using, for example, photolithography. Photoimagable polyimide may be used to facilitate fabrication of the grooves. The walls of the optical interconnect channels are made to be optically reflective, such as by coating the channel walls with a reflective metal. A upper layer 260 overlies layer 250 to enclose the optical interconnections, thereby forming free space channels in the substrate. Upper layer 260 has input and output openings 262, 263, to allow light to enter and leave the optical interconnect channels. Upper layer 260 may also be formed from a polymer. In the embodiment depicted in FIG. 2A, the ends of the channels are angled to redirect light traveling horizontally in the channels to input and output openings, 262, 263 in upper layer 260 so that the light leaves and enters the optical path vertically.

FIG. 2B shows a cross-section view of the multichip module of FIG. 1B, taken along view lines 2—2, illustrating how the optical interconnect 119 connects two devices in accordance with an embodiment of the present invention using a free space light path formed within interposer 110. Interposer 110 is formed from silicon plates 202 and 204. In one embodiment, the plates are fabricated separately and then upper plate 204 is mounted on lower plate 202. Interposer 110 contains the light guiding channel 119 that connects IC 102 to IC 104.

As depicted in FIG. 2B, several chips (i.e., 102, 104, 106, and 108) may be mounted on interposer 110. Some or all of the chips may incorporate light generating devices 206, such as light emitting diodes (LEDs) or vertical cavity surface emitting lasers (VCSELS) and light sensing devices such as photodiodes (PDs), for transmission and reception of optical signals, respectively. During operation, light propagates through light guiding channel 118 formed in the interposer 110. Interposer 110 may also have through vias 208 for vertical electrical interconnection, if necessary. The ICs are attached to the interposer and interposer is attached to the substrate 112 by means of, for example, solder joints. LEDs and PDs 208 can also be mounted on the board to provide optical interconnection between the chips and the board. If necessary the board can also have, for example, optical waveguides or free space light channels connecting this MCM to other MCMs or to other optical board-to-board interconnects. In the embodiment depicted in FIG. 2B, wire bonds 210 also provide electrical interconnections between interposer 110 and the PCB 112.

FIGS. 3, 4, and 5 show an exemplary structure for forming an optical channel in a silicon interposer to connect two chips mounted on the interposer. FIG. 3 shows side 302 and top 304 views of a top silicon plate 300 used for forming an optical channel in accordance with the present invention. The top plate 300 is fabricated from any suitable material, for example, a standard silicon wafer. The thickness of top plate 300 is selected depending on the needs of the specific design. Through holes 306 and 308 are formed in plate 300 by one of the standard techniques known in the industry, for example reactive ion etching (RIE) or laser drilling. The through holes can be formed having diameters as small as 10–15 μm (micrometers) depending on the thickness. In presently preferred embodiments, the diameter for the through holes is in the range of 20–100 μm. While circular through holes are generally easiest to fabricate, the holes can have shapes other than circular, such as a square, etc.

FIG. 4 shows top 402, cross section side 404, and cross section end 406 views of a bottom silicon plate 400 used for forming a free space light channel in accordance with one embodiment of the present invention. The cross section side view 404 is taken at cross section indicator (IV—IV), and the cross section end view 406 is taken at cross section indicator (IV').

In accordance with an embodiment of the present invention, bottom plate 400 is made from a silicon wafer having a (100) crystal orientation, and groove 407 is formed by direction selective wet etch. Due to the etch selectivity along <111> and <100> directions of the silicon crystal, tapered groove 408 is formed. Groove 408 has sidewalls 410, 412, 414 etched at a 54 degree angle. An advantage of using silicon etched in this manner is that the etched surface is inherently atomically smooth as a result of the etching process. This provides an excellent reflective surface for light transmission. The groove can be terminated with a flat surface at the bottom, as shown at 416, or can be etched until the sidewalls intersect. The width and depth of the groove may be very precisely controlled by the initial masking process and the etch time. In the case of no flat surface at the bottom of the groove, the depth is etch time independent. The depth of the groove is preferably from 10–100 μm and the width is on the same order.

FIG. 5 shows a structure 500 that forms a free space optical guiding channel 502 when the top 300 and bottom 400 plates are combined together. FIG. 5 illustrates the cross-sectional views (IV—IV and V—V) of the combined top 300 and bottom 400 silicon plates. Top silicon plate 300 is mounted on bottom silicon plate 400, and may be attached thereto by, for example, wafer bonding techniques known in the industry. Suitable bonding techniques include, for example, using conventional high temperature or low temperature processes, anodic bonding, etc. A thin layer of silica, solder, or the like may be applied to the exposed surface of the top and/or bottom plates as part of the bonding process. An easy method is to use high temperature, high pressure bonding with a thin oxide layer.

Silicon is not transparent to light with wavelengths below 1.1 μm. Because the walls of channel 502 are smooth, they are highly reflective to light below the transparency threshold, e.g., light at a wavelength of 850 nm, propagating in the channel. To further improve the reflectivity of the walls, or if a substrate other than silicon is used, the surfaces of the channels may be metallized, for example, with a thin metal film of aluminum or gold, to further enhance the reflectance of the walls. It is noted that in the preferred embodiment, the channel is devoid of any solid or liquid material and is, therefore, referred to as a "free space" channel. However, depending on the operating conditions, the channel may be filled with gaseous material such as air, or an inert gas.

Referring to the structure 500 of FIG. 5, light (e.g., from a LED source, not shown in FIG. 5) enters an input end of the channel through hole 306 and is reflected by the angled surface of the silicon channel formed in the bottom plate 400, such that the light is directed into the channel 502. After propagation through the channel, light is reflected off of the 54 degree mirror wall at the other end of the channel and is redirected to the output vertical through hole 308. Since the angle of the tilted surfaces is 54 degrees and not 45 degrees, the coupling of light between the through holes (306, 308) and the horizontal channel 502 may be further optimized by an appropriate design of the through holes, the channel dimensions, and their locations. The highly reflective straight silicon channel can transmit light with relatively low losses. Some coupling losses on the tilted surfaces and propagation losses in the silicon channel are unavoidable, but over relatively short distances, these losses are acceptable.

FIG. 5 shows a basic or "2D" structure for a horizontal free space light guide constructed in silicon in accordance with the present invention. As described in the following sections, the light guiding channel formed in a silicon interposer can be formed to support more complex optical signal routing.

FIG. 6 shows a cross-sectional view of a silicon interposer 600 that includes two light guiding levels, thereby providing complex or "3D" signal routing in a silicon system in accordance with a further aspect of the present invention. Interposer 600 comprises three silicon plates (602, 604, and 606) in a stack as shown. During operation, a light beam (e.g., from a LED source, not shown in FIG. 6) enters the light guide at input vertical channel 608, having an opening at the entrance thereto. Angled reflective surface 610 directs the light into a horizontal channel 612. Reflective surface 614 redirects the light to reflective surface 616, which redirects the light into channel 618. Reflective surfaces 620 and 622, cause the light to propagate through channels 624 and 626, respectively. Lastly, the light signal is directed through channel 626 and out through output opening 628. Thus, the silicon substrate 600 provides for routing of optical signals in multiple directions, which facilitates complex routing of signals in a substrate.

The above illustration is only representative and not limiting of how silicon channels can be used for complex optical routing. Silicon plates can be stacked in many layers where complex routing schemes are required. The pitch between vertical holes and horizontal grooves can be reduced to below 100 um. Since no capacitive or inductive interactions are present, the minimum pitch is limited by the fabrication processes used, the mechanical stability of the structure, and the dimensions of the light emitting and detecting devices.

FIGS. 7A and 7B show a silicon interposer structure 700 for redirecting light 90 degrees in a horizontal plane using silicon light guiding channels constructed in accordance with a further aspect of the present invention. Two orthogonal, unconnected grooves 702 and 704, are formed in a bottom plate 700. A groove 706 is also etched in the bottom surface of the top silicon plate 708. The top and bottom plates are aligned and assembled as shown at 710, such that groove 706 bridges between grooves 702 and 704. (For simplicity, the input and output holes in top plate 708 are not shown.) In order to cause the light to rotate 90 degrees in the horizontal plane, the light is first reflected upward from channel 702 into channel 706, and then downwards from channel 706 into channel 704. Careful selection of the groove dimensions and their mutual positions allows low loss coupling between the orthogonal channels 702 and 704.

Combining horizontal channels with vertical "though the wafer" coupling as shown in FIG. 5, horizontal light bending as shown in FIGS. 7A and 7B, and complex routing as shown in FIG. 6, enables complete flexibility of in the design of the optical interconnects on etched silicon substrates, such as interposers used in MCM's. Use of silicon is considered advantageous because silicon processing technologies are very well developed, and the etching process applicable to silicon results in highly reflective walls with excellent geometry for redirecting light.

FIG. 8 illustrates a process for fabrication of tapered grooves in a silicon interposer. A silicon substrate that includes a light guiding structure comprises two major elements: through holes and tapered grooves. As previously described, the through holes can be formed in a silicon wafer by any known process, for example, RIE or laser drilling.

Referring now to FIG. 8, photolithographic processing is used to form grooves. In one example a silicon substrate 800, such as a wafer, is first covered with a thin layer of a masking material such as silicon dioxide 802. A photoresist (PR) 804 is coated on the silicon dioxide, exposed through a mask, and developed. Etching is then use to create a patterned silicon dioxide layer. The patterned silicon dioxide layer then serves as a hard mask for the silicon etch. Silicon groove 808 is anisotropically etched into the substrate, for example, using potassium hydroxide (KOH) or ethylene diamine pyrocatechol (EDP) solutions. A suitable KOH solution consists of KOH, isopropyl alcohol and water and a suitable EDP solution consists of EDP and water. Various concentrations of the solution component can be used depending on the etch requirements. The silicon dioxide mask layer may then be removed by wet etching if required for further processing.

A top plate 810 is then mounted on bottom plate 800 to form the final substrate 812. The top and bottom plates is then preferably attached to one another by any suitable means, for example, standard wafer bonding techniques. If no metal lines or groove surface metallization are present on the silicon plates, then a high temperature bonding is appropriate. In case of low temperature requirements, the plates can be attached with low-temperature bonding techniques, for example, processes using thin adhesive layers, thin solder layers, etc.

One or more through holes 814 can be etched in the top plate prior to mounting, to form an input and an output to the light guide. More complex structures can be created using these same basic processing techniques to provide complex or 3D light signal routing. For example, as previously described, a complete routing scheme may contain through holes in both top and bottom plates, as well as channel grooves, and may utilize more than two plates.

All processes required for fabrication of the silicon plates or other substrates are well established in the semiconductor industry. One of the benefits of using silicon is that there are many well-developed and well-understood processing technologies available for precisely forming structure in silicon wafers. In the context of the present invention, since no sub-micron precision is required, the equipment for fabrication of the plates is very cost effective.

FIGS. 9A–C show interposer structures with light guiding channels formed in a polymer layer formed on a rigid base layer. In such embodiments any suitable material may be used as the base layer. For example, a silicon wafer may be used in connection with the fabrication of an interposer. A gray scale mask may be used to form tapered surfaces in the polymer layer using photolithography.

Formation of grooves and angled surfaces (which act as mirrors) directly in a silicon substrate results in some geometrical limitations, for example, the slope angles of the walls are defined by the nature of the silicon crystal to be 54 degrees. In an alternate embodiment of the present invention, the channels and grooves are formed in polymer layers deposited on silicon or other suitable base. The specific polymer selected is preferably not be optically transparent material since no light should be allowed to propagate through the material. (However, if a reflective coating is formed on the channel walls, then the transparency of the polymer is unimportant.) The thickness of the polymer films can be from several microns up to 100 $\mu$m or more. It is preferred that the polymer be photo-definable, i.e., it can be directly patterned with light exposure without etching. A number of photo-definable polymers are available on the market. Some of the most commonly used are polyimide or epoxy based.

Referring to FIG. 9A, a cross section of another embodiment of the present invention is shown. In the embodiment of FIG. 9A, a polymer layer 903 is deposited on base layer 901. An insulating layer 902 may optionally be positioned between substrate 901 and polymer layer 903, depending on the nature of the substrate and polymers selected. For example, layer 902 may be used to enhance adhesion or to isolate metal deposited within grooves formed in the polymer layer from the base layer.

Channel 905 is formed in the polymer layer by means of photolithography. As shown, angled surfaces 908 and 909, formed using, for example, a gray-scale mask, act as mirrors to redirect the light between vertical and horizontal, thereby providing an input and an output for the light guide. Preferably, the angled surfaces at the input and output are set at 45 degrees. However, in some embodiments it may be desired to use a different angle. Channel 905, including angled surfaces 908 and 909, is preferably coated with a material to form a thin layer 907 which is reflective to the wavelengths of light transmitted in the channel. Preferably, the material used to form reflective layer 907 is a metal such as gold or aluminum. Techniques for depositing suitably thin metal layers are well known. The walls of groove 905 may be substantially vertical, or may have a slope. Sloped walls may be used to facilitate the coating the walls with a reflective material, depending on the coating process selected.

A cover layer 904 is used to enclose the free space light guide. Cover layer 904 may be formed of any suitable material and may have input and output holes formed therein, as previously described. Alternatively, cover layer 904 may be formed of a material which is transparent to the light wavelength(s) of interest, such that light can be vertically directed into and out of the light guide through the cover layer, without the necessity of forming holes therein. In this alternative, although the light is able to travel vertically through cover layer 904, once the light is reflective into channel 905, it will propagate within the channel in a direction which is predominantly close to being parallel to the substrate. In preferred embodiments, there is a sufficiently large difference between the indices of refraction of the free space light channel (which normally will be filled with gas) and overlying cover layer 904, such that once light rays are reflected into the channel they will, thereafter, strike cover layer 904 above the critical angle and will, therefore, be reflected back into the channel. Therefore, even though cover layer 904 is transparent, transmission losses as light propagates in the channel are minimal. However, to reduce such losses in the embodiment wherein a transparent cover layer is used, the surface of the plate overlying the channel may also be coated with a reflective material, other than in the input and output areas.

Cover layer 904 is mounted on polymer layer 903. They may be attached to one another using any suitable technique such as thermal bonding, thin adhesive films, metallic solder, etc.

FIG. 9B is a top cross section of another embodiment of a light guide of the present invention. A substantially vertical reflective angled surface 910 is formed in polymer layer 903 using standard photolithographic and coating techniques. This angled surface formed in a polymer layer can light redirect in the plane of the substrate to provide more complex light guiding in the channel.

FIG. 9C shows an cross sectional view of an exemplary free space light channel having a two polymers layers configured to provide complex or 3D light guiding of light from input aperture 920 to output aperture 925. In this embodiment, opposing angled surfaces form mirror pair 930, 935 which redirects light from channel 905a formed in first polymer layer 903 into channel 950 in second polymer layer 906 mounted on top of layer 903. Thereafter, opposing angled surfaces form mirror pair 940, 945 redirect the light from channel 950 back into channel 905b in first polymer layer 903. For exemplary purposes, in FIG. 9C light is shown traveling in a single horizontal direction. In practice, complex 3D routing in multiple directions may be achieved.

FIG. 10 shows an exemplary gray scale mask 926 for use in creating sloped surfaces in a polymer layer accordance with the present invention. FIG. 10 depicts a gray scale mask 1000 used to form the channel of FIG. 9A. Gray scale mask having transparent regions 1020, an opaque region 1030 and graded density regions 1010, is aligned on polymer layer 903. (The mask depicted in FIG. 10 is for use with a negative photoimageable polymer. For positive working the opaque, transparent and transition areas would be reversed.) The structure is then irradiated with actinic radiation, such that the radiation is able to penetrate through transparent regions 1020, and is able to partially penetrate through graded density regions 1010 such that the exposure in the grade density regions 1010 is a function of the optical density of the mask. After irradiation the polymer has exposed portions 903x, an unexposed portion 903u, and partially exposed portions 903p. In accordance with standard photolithographic techniques, mask 1000 is then removed and the exposed photoimageable polymer is developed to form a groove or channel with angled surfaces at the ends thereof. Depending on the optical density distribution in the gray scale mask the exact shape and slope of the channel, including angled surfaces, can be controlled using photolithography.

FIGS. 11A–11C show intermediate structures in fabricating the complex free space light guide of FIG. 9C. FIG. 11A shows the bottom portion of the light guide formed by photolithography, as described above, of polymer layer 903 on a base layer 901, such that a plurality of channels portions, e.g., 905a and 905b are created. Channels portions are then, preferably, coated with a highly reflective film, such as a thin layer of aluminum or gold. Methods of metallic film deposition are well known. One convenient method is sputtering. As noted above, an insulating layer 902 may be used to isolate substrate 901 from the deposited metallic film or to enhance adhesion. After deposition of the reflective film, an adhesive layer may, optionally, be deposited on the very top of the structure. Organic or metallic adhesive materials may be used.

FIG. 11B shows the upper structure of the complex light guide. This structure is fabricated on a rigid temporary base layer 1101. Any suitable material may be used for the temporary base layer, for example, silicon. A sacrificial layer 1102 is then formed on the temporary substrate 1101. After the upper polymer layer is formed and mounted on the lower polymer layer 903, as described below, the temporary substrate 1101 and sacrificial layer 1102 are removed. Sacrificial layer 1102 may be any suitable material which can be formed on top of temporary substrate 1101 with sufficient uniformity, and which can be selectively etched relative to the other materials used in the light guide. For example, sacrificial layer 1102 may be porous silicon which is formed by electro-chemical etching the upper surface of a temporary base layer made of silicon. Porous silicon is easily etched in a wet etching process because the porous structure allows easy penetration of the etchant. Further, porous silicon has a planar surface which allows easy formation of uniform layers on top of it. For example, the various polymer layers maybe spin coated onto a planar porous silicon sacrificial layer. Alternatively, the temporary substrate may be glass or a PCB, with a gel-pack layer with the adhesive side attached to the temporary base layer and the gel side "up" to support the various polymer layers. The sacrificial gel-pack layer can then be easily removed using isopropyl alcohol or acetone. Other materials which may be used as sacrificial layers.

After transparent polymeric layer 904 is formed on sacrificial layer 1102, an overlying photo-definable polymer is formed and features, such as a light channel 950 and input/output apertures 920, 925, are created therein using photolithography as described above. A thin reflective film is then coated on the exposed surfaces of layer 906. Thereafter, an adhesive layer may, optionally, be formed on top of the resulting structure.

The top structure of FIG. 11B is then flipped, aligned and mounted on the bottom structure of FIG. 11A as shown in FIG. 11C. The two parts may be attached using the optional adhesive layers. The sacrificial layer 1102 and the temporary substrate 1101 are then removed, leaving the free space light guide depicted in FIG. 9C.

The present invention includes a system for providing a substrate with channels for optical interconnects. The embodiments described above are illustrative of the present invention and are not intended to limit the scope of the invention to the particular embodiments described. Accordingly, while one or more embodiments of the invention have been illustrated and described, it will be appreciated that various changes can be made therein without departing from the spirit or essential characteristics thereof. For example, while the present invention describes the use of silicon to form the substrate, other materials including glass or ceramics may be used. Accordingly, the disclosures and descriptions herein are intended to be illustrative, but not limiting, of the scope of the invention, which is set forth in the following claims.

What is claimed is:

1. A substrate for mounting one or more active devices, comprising:
   a first generally planar body having a groove formed therein, said groove having walls which are reflective to at least one light wavelength, and further comprising at least one angled reflective surface to redirect said light traveling within said groove,
   a cover layer mounted on said first body, said cover layer having a surface portion which covers and encloses a major portion of said groove, thereby forming an substantially enclosed free space optical path within said substrate.

2. The substrate of claim 1 wherein said first body comprises silicon.

3. The substrate of claim 2 wherein said silicon is crystalline silicon having a (001) orientation and said groove has walls which have an angle of approximately 54 degrees.

4. The substrate of claim 2 wherein said cover layer is formed from silicon.

5. The substrate of claim 2 wherein said first body comprises a polymer layer and said groove is formed in said polymer layer.

6. The substrate of claim 1 wherein said optical path comprising complex routing of said light.

7. The substrate of claim 1 further comprising an additional layer, mounted on top of said cover layer, generally planar body, wherein said cover layer has at least one groove formed therein which is optically coupled to at least one groove formed within said first planar body.

8. A substrate for mounting one or more active devices, comprising:
   a generally planar rigid base layer,
   a first polymer layer formed above said rigid base layer, said polymer layer having at least one groove formed therein, said groove having walls that are reflective to a desired wavelength of light, and having at least one angled surface for redirecting light propagating within said groove,
   a cover layer formed above said first polymer layer, said cover layer having upper and lower surfaces and being substantially transparent to light traveling generally normal to said upper and lower surfaces, and,
   a light input and a light output for communicating light into and out of said substrate.

9. The substrate of claim 8, wherein said first polymer layer is a photo-definable polymer.

10. The substrate of claim 8 wherein said angled surface redirects light within the plane of said polymer layer.

11. The substrate of claim 8 wherein said groove and said angled surface are coated with a reflective material.

12. The substrate of claim 11 wherein said reflective material is a thin metal film.

13. The substrate of claim 8 further comprising a second polymer layer positioned between said cover layer and said first polymer layer, said second polymer having at least one groove formed therein which is optically coupled to a groove formed within said first polymer layer, said at least one groove having walls which are reflective to said light, and an angled surface for redirecting light traveling in said groove.

14. The substrate of claim 13 wherein the direction of a groove in said first polymer layer is different than the direction of a groove in said second polymer layer.

15. The substrate of claim 8 wherein an insulating layer is formed between said rigid base layer and said first polymer layer.

16. The substrate of claim 8 wherein said rigid base layer is silicon.

* * * * *